Dec. 23, 1958 G. R. INGRAM 2,865,093

METHOD OF SILVER DIP SOLDERING

Filed May 20, 1957

INVENTOR.
GROVER R. INGRAM
BY
Paul R. Webb, II
ATTORNEY

United States Patent Office 2,865,093
Patented Dec. 23, 1958

2,865,093

METHOD OF SILVER DIP SOLDERING

Grover R. Ingram, Reading, Ohio, assignor to General Electric Company, a corporation of New York Application May 20, 1957, Serial No. 660,131
4 Claims. (Cl. 29—488)

My invention relates to a method of silver dip soldering and more particularly to an improved method of silver dip soldering an electronic assembly which is adapted to operate in a high temperature range of 750° F. to 1350° F.

One type of electronic assembly, operating in a temperature range below 750° F., includes a sheet of electrically insulating material, such as laminated sheets of paper impregnated with a synthetic resin, carrying on one surface of the sheet one or more electrical conductors in the form of thin, flat strips integrally united with the insulating material. After circuit components are mounted on other side or upper surface of the sheet of insulating material, conductor side or lower surface, with leads from circuit components projecting through various points, is dipped beneath the surface of a bath of molten solder which has a conventional composition of tin and lead. After leads are soldered to conductors, the assembly is removed from the solder bath.

In non-electronic fields, associated joints of articles have been coated with a suitable flux and dip soldered in a molten bath of silver solder to provide soldered devices. Furthermore, article parts have been fluxed and dip soldered in a copper-zinc bath which employed a granular stratum on the bath to retard oxidation.

Development of high temperature aircraft and missile propulsion systems has created a problem of providing electronic assemblies which will operate in a high temperature range of 750° F. to 1350° F. Such an assembly requires an electrically insulating sheet having on at least one surface thereof one or more electrical conductors, a plurality of circuit components on the reverse sheet side, and soldered connections between electrical conductors and circuit components. A ceramic insulating sheet having a plurality of thin silver conductors on at least one surface and a number of high temperature components on the reverse surface which are joined by silver solder connections presents an electronic assembly which is adapted for high temperature propulsion systems. Furthermore, it would seem that a silver dip soldering process could be employed to connect circuit components and conductors simultaneously in such an assembly.

However, the above type of dip soldering operation resulted in incomplete solder connections or in complete melting and removal of silver conductors from insulating sheet. The former condition appeared to be caused by a layer of oxide which formed adjacent to the open surface of the molten silver solder bath. If the assembly was immersed in such a bath for a longer period to attempt a complete solder connection, conductor material united with solder leaving a bare ceramic sheet. If a granular stratum is employed on a silver solder bath, granular material clogs the space between conductors and associated leads resulting in incomplete solder connections.

My present invention provides an improved method of silver dip soldering a high temperature electronic assembly which produces rapid and complete solder connections.

Accordingly, it is an object of my invention to provide an improved method of silver dip soldering which employs a flux free, molten silver solder bath having a covering layer of molten aluminum thereon.

It is another object of the invention to provide an improved silver dip soldering method which prevents oxidation of the silver solder bath.

It is a further object of the invention to provide a rapid method of silver dip soldering which prevents removal of silver conductor material from an assembly during the soldering process.

In carrying out my invention in one form, an article is dipped in a molten silver solder bath having a covering layer of molten aluminum thereon, immersed in the silver solder bath, and removed from the bath to provide a solder coated article.

These and various other objects, features and advantages of the invention will be better understood from the following description taken in connection with the accompanying drawing in which.

Figure 1:
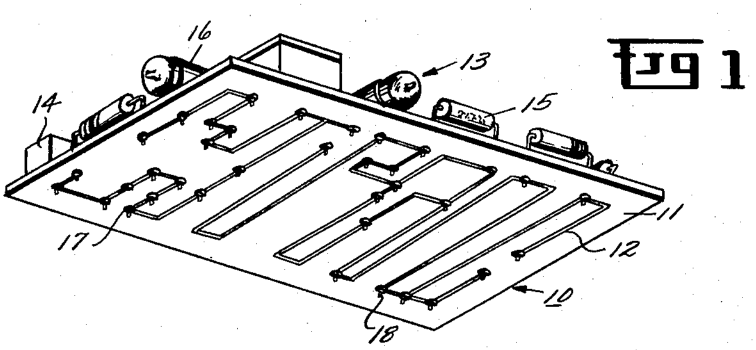
Fig. 1 is a prospective view of the underside of an electronic assembly to which the silver dip soldering process of the present invention is applied.

In Fig. 1 of the drawing, an electronic assembly 10 is shown which comprises an insulating sheet 11 of a high temperature resistant ceramic material, a plurality of electrical conductors 12 on lower surface of sheet 11, and a plurality of circuit components 13 such as capacitors 14, resistors 15, and vacuum tubes 16, on the reverse or upper surface of sheet 11. A series of small diameter apertures are located in sheet 11 and fitted with stainless steel, brass or silver eyelets 17 to accommodate wire leads 18 extending from circuit components 13. Each eyelet 17 is connected to its associated conductor 12 which is in the form of a thin strip of silver or platinum foil, wire or paint united integrally to lower surface of sheet 11. If it is desired, conductors can also be located on the upper surface of the sheet.

Figure 2:
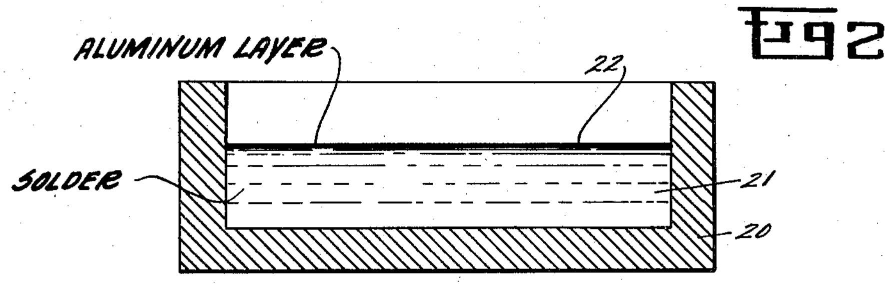
Fig. 2 is a sectional view of a solder vessel containing a molten silver solder bath having a covering layer of molten aluminum thereon.

In Fig. 2, a zirconium solder vessel 20 is shown which contains a molten silver solder bath 21 having a covering layer 22 of molten aluminum floating thereon. I have found that various types of silver solder and aluminum can be employed for the present silver dip soldering process. If an electronic assembly is soldered, the silver solder and aluminum must not set up thermal E. M. F.'s at connecting points during the operation. Examples of silver solders which meet these conditions have the following alloy compositions:

TABLE 1

| No. | Silver, percent | Copper, percent | Zinc, percent | |
|---|---|---|---|---|
| 1 | 50 | 15½ | 16½ | 18% Cd |
| 2 | 50 | 15½ | 15½ | 16% Cd, 3% Ni |
| 3 | 45 | 15 | 16 | 24% Cd |

These solder alloys have the following properties:

TABLE 2

| No. | Melting Point, ° F. | Flow Point, ° F. | Specific Gravity |
|---|---|---|---|
| 1 | 1,160 | 1,175 | 9.49 |
| 2 | 1,170 | 1,270 | 9.49 |
| 3 | 1,125 | 1,145 | 9.34 |

The term, "flow point," has been interpreted to mean the temperature at which a substantial part of alloy melts, or the lowest point at which a joint can be made. In the above table, flow point means the temperature at which all of the alloy is completely molten. A bath 21 of molten silver solder is prepared in vessel 20 by heating a silver solder alloy selected from Table 1 to its flow point. While no heating apparatus is shown in the drawing, any conventional system is employed to heat and maintain a desired temperature during the soldering process.

I have found that standard designation alloys 2S and EC provide a desirable aluminum layer 22 to cover silver solder bath 21. Alloys 2S and EC contain minimum aluminum contents of 99.0% and 99.45%, respectively, and remainders of normal impurities. Alloy 2S is available in flat or coiled sheet while alloy EC is obtainable in wire, rod and bar form. A sheet of aluminum is placed on surface of bath 21 in vessel 20, and is heated to about 1220° F. to convert it to its molten state. While specific gravity of both alloys 2S and EC are lower than silver solder alloys in Table 1, aluminum was believed to form a suspension with silver solder. However, I discovered unexpectedly that a layer of molten aluminum floats on a molten silver solder bath, is inert with respect to the bath, protects a silver surface to be soldered, and prevents oxidation of the bath. While aluminum layer thickness is not critical, it is necessary that a thin aluminum layer cover completely the bath. After molten aluminum layer 22 floats on molten silver solder bath 21, bath working temperature is raised to about 1350° F. for the soldering process.

Figure 3:
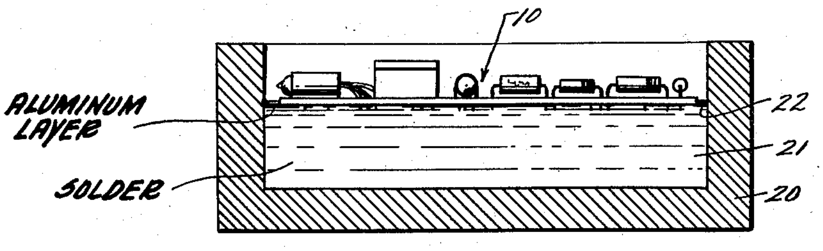
Fig. 3 is a sectional view of the solder vessel of Fig. 2 showing one manner of immersing the assembly of Fig. 1 therein.
Figure 4:
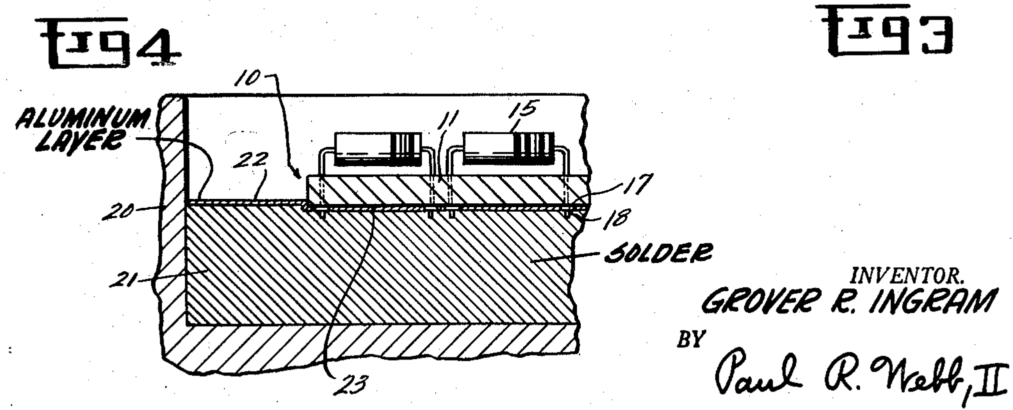
Fig. 4 is an enlarged sectional view of a portion of the solder vessel, bath and assembly which are shown in Fig. 3.

Figs. 3 and 4 disclose assembly 10 of Fig. 1 dipped into bath 21 within vessel 20 of Fig. 2. As is best shown in Fig. 4, assembly 10 is located on the surface of bath 21 with conductor surface of sheet 11 positioned adjacent the interface between silver solder bath 21 and aluminum layer 22. A thin film 23 of layer 22 separates the silver conductors from bath 21 to protect the conductors and prevent oxidation of the bath. Leads 18 are immersed in bath 21 whereby sufficient silver solder flows up leads 18 to the space between leads 18 and eyelets 17 to form simultaneously complete connections therebetween.

In carrying out the silver dip soldering process of the present invention, leads 18 of a plurality of circuit components 13 are immersed in a suitable, non-corrosive silver solder flux and then removed therefrom. These circuit component leads are then dipped in solder vessel 20 having a molten silver solder bath 21 and a covering layer of aluminum thereon. Each circuit component 13 is held over the solder vessel surface and its leads 18 are immersed through aluminum layer 22 into silver solder bath 21 to coat the leads with silver solder. Subsequently, circuit component leads 13 are removed from silver solder bath 21 and allowed to cool.

These circuit components are positioned on the upper surface of high temperature ceramic insulating sheet 11 with their leads 18 accommodated in eyelets 17 and projecting from the lower surface of the sheet. Eyelets 17 are connected to their associated conductors 12 which are united integrally with sheet 11.

After circuit components 13 are positioned on ceramic sheet 11, assembly 10 is dipped into a solder vessel 20 having a molten silver solder bath 21 and a covering layer of aluminum thereon. Assembly 10 is located on the surface of bath 21 with conductor surface of sheet 11 positioned adjacent the interface between silver solder bath 21 and aluminum layer 22. A thin film 23 of layer 22 separates conductors 12 from bath 21 whereby neither conductors 12 are destroyed nor bath 21 is oxidized. Although conductors 12 are protected by film 23, leads 18 are immersed briefly into bath 21 causing silver solder to flow up to space between each lead 18 and its associated eyelet 17. Immersion time varies with the size of assembly 10. Since this process step is visible to the operator from the upper surface of sheet 11, he knows when complete solder connections have been made. The operator removes assembly 10 from bath 21 in vessel 20 and allows cooling thereof. All leads 18 are connected to their associated eyelets 17 to provide an electronic assembly which is adapted to operate in a high temperature range.

A preferred example of a process in accordance with the present invention is as follows:

*Example 1*

Leads of a plurality of circuit components, such as shown in Fig. 1, are immersed in a suitable, non-corrosive silver solder flux, such as "Sil-Flux," manufactured by United Wire Company, and then removed therefrom. These leads are then dipped in a solder vessel having a molten silver solder bath and a covering layer of aluminum thereon as shown in Figure 2. Each circuit component is held over the solder vessel surface and its leads are immersed through the aluminum layer into the silver solder bath to coat the leads with silver solder. Subsequently, circuit component leads are removed from silver solder bath and allowed to cool.

These circuit components are positioned on the upper surface of a high temperature ceramic insulating sheet with their leads accommodated in brass eyelets and projecting from the lower sheet surface. Eyelets are connected to a plurality of associated thin silver strip conductors on the lower sheet surface which are united integrally with the sheet by a firing process.

After circuit components have been positioned on the ceramic sheet, the assembly is dipped in a zirconium solder vessel having a 1 inch deep molten silver solder bath and a .001 inch deep covering layer of molten aluminum thereon. A silver solder is employed which has a composition of 45% silver, 15% copper, 16% zinc and 24% cadmium while the aluminum layer has a minimum aluminum content of 99.0%. Solder bath is maintained at a working temperature of 1350° F. during the soldering process.

Conductor surface of the assembly is retained for 3 seconds at interface between solder bath and aluminum layer. In this position, conductor surface is protected by a thin film of aluminum, while a portion of each of the leads projects into the silver solder bath to cause silver solder to flow up each lead and form a connection between each lead and its associated eyelet. The assembly is then removed from the silver solder bath and allowed to cool.

Another example of the method of the invention is as follows:

*Example 2*

An electronic assembly is prepared as set forth in Example 1. However, silver eyelets and silver paint conductors replace the brass eyelets and thin silver strip conductors in Example 1. After circuit components have been positioned on the ceramic sheet, the assembly is dipped in a zirconium solder vessel having a 1 inch deep molten silver solder layer and a .001 inch deep covering layer of molten aluminum thereon. A 50% silver, 15½% copper, 15½% zinc, 16% cadmium, and 3% nickel solder bath is used while the aluminum layer has a minimum aluminum content of 99.0%. Bath temperature is maintained at 1345° F. during the soldering operation.

Assembly conductor surface is retained for 3 seconds at interface between solder bath and aluminum layer. In this position, conductor surface is protected by a thin film of aluminum, while a portion of each of the leads projects into the silver solder bath to cause silver solder to flow up each lead and form a connection between each lead and its associated eyelet. The assembly is then removed from the silver solder bath and allowed to cool.

Another example of the method of invention is as follows:

*Example 3*

An electronic assembly is prepared as set forth in Example 1. Stainless steel eyelets and thin platinum strip conductors are used rather than the silver eyelets and silver paint conductors in Example 2. When the circuit components have been placed on the insulating sheet, the assembly is dipped in a zirconium solder vessel having a 1 inch deep molten silver solder layer and a .001 inch deep covering layer of molten aluminum thereon. An aluminum layer is employed which has a minimum aluminum content of 99.45%. The silver solder bath has a composition of 50% silver, 15½% copper, 16½% zinc, and 18% cadmium. A working temperature of 1350° F. is maintained in the bath.

Conductor surface of the assembly is retained for 3 seconds at interface between solder bath and aluminum layer. In this position, conductor surface is protected by a thin film of aluminum, while a portion of each of the leads projects into the silver solder bath to cause silver solder to flow up each lead and form a connection between each lead and its associated eyelet. The assembly is then removed from the silver solder bath and allowed to cool.

As will be apparent to those skilled in the art, the objects of my invention are attained by dipping an article in a molten silver solder bath having a covering layer of aluminum thereon, immersing the article in the silver solder bath, and removing the article from the bath to provide a solder coated article.

While other modifications of this invention and variations of the method which may be employed within the scope of the invention have not been described, the invention is intended to include all such as may be embraced within the following claims.

What I claim as new and desire to secure by Letters Patent of the United States is:

1. A method of dip soldering an assembly having a sheet of high temperature insulating material, at least a single electrical conductor disposed on a surface of said sheet, at least a single small diameter aperture located in said sheet and associated with said conductor, and at least one electrical lead positioned in said aperture which comprises dipping said assembly in a molten silver solder bath having a covering layer of molten aluminum thereon, immersing said electrical lead in said silver solder bath to form a solder connection in said small diameter aperture between said conductor and said lead, and removing said assembly from said bath.

2. A method of dip soldering an assembly having a sheet of high temperature insulating material, a plurality of electrical conductors disposed on at least one surface of said sheet, a series of small diameter apertures located in said sheet and associated with said conductors, and an electrical lead positioned in each of said apertures and associated therewith which comprises dipping said assembly in a molten silver solder bath having a covering layer of molten aluminum thereon, immersing said electrical leads in said silver solder bath to form a solder connection in each of said small diameter apertures between each conductor and its associated lead, and removing said assembly from said bath.

3. A method of dip soldering an assembly having a sheet of high temperature insulating material, a plurality of electrical conductors disposed on at least one surface of said sheet, a series of small diameter apertures located in said sheet and associated with said conductors, and an electrical lead positioned in each of said apertures and associated therewith which comprises dipping said assembly in a molten silver solder bath having a covering layer of molten aluminum thereon, said aluminum layer adapted to prevent oxidation of said silver solder bath, positioning the conductor surface of said sheet adjacent to the interface between said silver solder bath and said aluminum layer, allowing a thin film of aluminum to separate said conductors from said silver solder bath, said film adapted to protect said conductors, immersing said leads in said silver solder bath to form a solder connection in each of said small diameter apertures between each conductor and its associated lead, and removing said assembly from said bath.

4. A method of dip soldering an assembly having a sheet of high temperature insulating material, a plurality of electrical conductors disposed on at least one surface of said sheet, a series of small diameter apertures located in said sheet, an eyelet fitted in each of said apertures and associated with said conductors, and an electrical lead positioned in each of said eyelets and associated therewith providing a limited space which comprises dipping said assembly in a molten silver solder bath having a covering layer of molten aluminum thereon, said aluminum layer adapted to prevent oxidation of said silver solder bath, positioning the conductor surface of said sheet adjacent to the interface of said silver solder bath and said aluminum layer, allowing a thin film of aluminum to separate said conductors from said silver solder bath, said film adapted to protect said conductors, immersing said leads in said silver solder bath to form a solder connection in the limited space between each eyelet and its associated lead, and removing said assembly from said bath.

References Cited in the file of this patent

UNITED STATES PATENTS

| | | |
|---|---|---|
| 1,719,512 | Krembs | July 2, 1929 |
| 2,507,780 | Gilbert | May 16, 1950 |
| 2,671,264 | Pessel | Mar. 9, 1954 |